(12) United States Patent
Tsai et al.

(10) Patent No.: US 8,130,531 B2
(45) Date of Patent: Mar. 6, 2012

(54) MAGNETIC MEMORY STRUCTURE AND OPERATION METHOD

(75) Inventors: Ching-Hsiang Tsai, Kaohsiung (TW); Kuei-Hung Shen, Hsinchu (TW); Chien-Chung Hung, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 270 days.

(21) Appl. No.: 12/690,093

(22) Filed: Jan. 19, 2010

(65) Prior Publication Data

US 2011/0090730 A1 Apr. 21, 2011

(30) Foreign Application Priority Data

Oct. 20, 2009 (TW) .............................. 98135459 A

(51) Int. Cl.
*G11C 19/00* (2006.01)
(52) U.S. Cl. .......................................... 365/80; 365/81
(58) Field of Classification Search .................. 365/80, 365/81, 85, 158, 171, 173
See application file for complete search history.

(56) References Cited

U.S. PATENT DOCUMENTS

| | | | |
|---|---|---|---|
| 6,834,005 B1 * | 12/2004 | Parkin | 365/80 |
| 6,898,132 B2 | 5/2005 | Parkin | |
| 6,955,926 B2 * | 10/2005 | Chen et al. | 438/3 |
| 7,236,386 B2 * | 6/2007 | Parkin | 365/80 |
| 2008/0278998 A1 * | 11/2008 | Cowburn et al. | 365/171 |
| 2009/0040883 A1 | 2/2009 | Kim et al. | |

* cited by examiner

*Primary Examiner* — Vu Le
(74) *Attorney, Agent, or Firm* — Jianq Chyun IP Office

(57) ABSTRACT

A magnetic memory structure includes a memory track which has consecutive magnetic domains. Each of the magnetic domains has memory capacity of one bit. A first domain-wall injecting layer intersects and connects a terminal of the memory track and constantly stores a first binary data. A second domain-wall injecting layer against the first domain-wall injecting layer intersects and connects the terminal of the memory track and constantly stores a second binary data different from the first binary data. The memory track and one of the first domain-wall injecting layer and the second domain-wall injecting layer together form a domain wall.

20 Claims, 11 Drawing Sheets

(a)

(b)

(c)

(d)

MAGNETIC MEMORY STRUCTURE AND OPERATION METHOD

CROSS-REFERENCE TO RELATED APPLICATION

This application claims the priority benefit of Taiwan application serial no. 98135459, filed on Oct. 20, 2009. The entirety of the above-mentioned patent application is hereby incorporated by reference herein and made a part of specification.

BACKGROUND OF THE INVENTION

1. Technical Field

The disclosure relates to a magnetic memory technology. More particularly, the disclosure relates to a magnetic shift register memory which conducts a domain wall motion technique.

2. Background

Research and development on conventional magnetic memories have been conducted for years. Moreover, theories and experiments regarding current-driven domain wall motion have proceeded maturely in recent years. In U.S. Pat. No. 6,834,005, a device structure referred to as a magnetic shift register capable of significantly increasing data storage capacity of chips or hard drives was disclosed. The magnetic shift register possibly replaces the existing dynamic random access memory (DRAM), the existing static random access memory (SRAM), and the existing flash chip. Moreover, the magnetic shift register realizes the concept of a "disk drive on a chip". In the magnetic shift register, a magnetic recording hard disk drive similar to the common hard drive is employed to record data one by one through current-driven domain wall motion. Since the magnetic shift register uses the stack structure to store data in a vertical memory track which occupies little space on the substrate, the magnetic shift register can be built with reducing for the equivalent bit size, and access speed of the magnetic shift register exceeds that of the conventional flash memory chip and hard drive.

FIG. 1 is a schematic view illustrating a conventional magnetic shift register designed by implementing a current-driven domain wall motion mechanism. As shown in FIG. 1, there is a plurality of magnetic domains 102 on a memory track 100. Each of the magnetic domains 102 has a magnetization direction to correspondingly store one bit of data, such as "0" or "1". a magnetization direction of. When binary data stored in adjacent two of the magnetic domains 102 are different, the two magnetic domains 102 then have opposite directions of magnetic moment, and a domain wall 104 is formed. By applying an electronic current flow I, the domain wall 104 moves in the direction of the current flow I, and thereby also moves the magnetic domains 102 in the memory track 100. When the magnetic domains 102 pass across a reading device 106 or a writing device 108, the data on the magnetic domains 102 can be read by the reading device 106 or written by the writing device 108 at the magnetic domains 102.

Nevertheless, further research and development are directed to improvement of memory device performance in order to effectively and accurately write data in the magnetic domains and simultaneously stabilize the device.

SUMMARY

In the embodiment, a magnetic memory structure including a memory track which has consecutive magnetic domains is provided. Each of the magnetic domains has memory capacity of one bit. A first domain-wall injecting layer intersects and connects a terminal of the memory track and constantly stores a first binary data. A second domain-wall injecting layer against the first domain-wall injecting layer intersects and connects the terminal of the memory track and constantly stores a second binary data different from the first binary data. The memory track and one of the first domain-wall injecting layer and the second domain-wall injecting layer together form a domain wall.

In another embodiment, an operation method of the aforesaid magnetic memory structure is also provided. The operation method includes applying a write-in pulse current to the first domain-wall injecting layer or the second domain-wall injecting layer to move the first binary data or the second binary data into one of the magnetic domains on the memory track.

In another embodiment, an operation method of the aforesaid magnetic memory structure is also provided. The operation method includes applying a first pulse current to the first domain-wall injecting layer or the second domain-wall injecting layer to move the first binary data or the second binary data into a terminal one of the magnetic domains on the memory track. Next, a second pulse current is applied to the memory track to move data of the terminal one of the magnetic domains to the memory track.

BRIEF DESCRIPTION OF DRAWINGS

The accompanying drawings are included to provide a further understanding of the embodiment and are incorporated in and constitute a part of this specification. The drawings illustrate embodiments and, together with the description, serve to explain the principles of the invention.

In the drawings.

DESCRIPTION OF EMBODIMENTS

Following embodiments are illustrative of certain applications of the principle of the invention but are not intended to limit the embodiment. Besides, combinations or modifications may be properly made to memory structures and methods described in the embodiment without departing from the spirit and scope of the invention.

Figure 1:
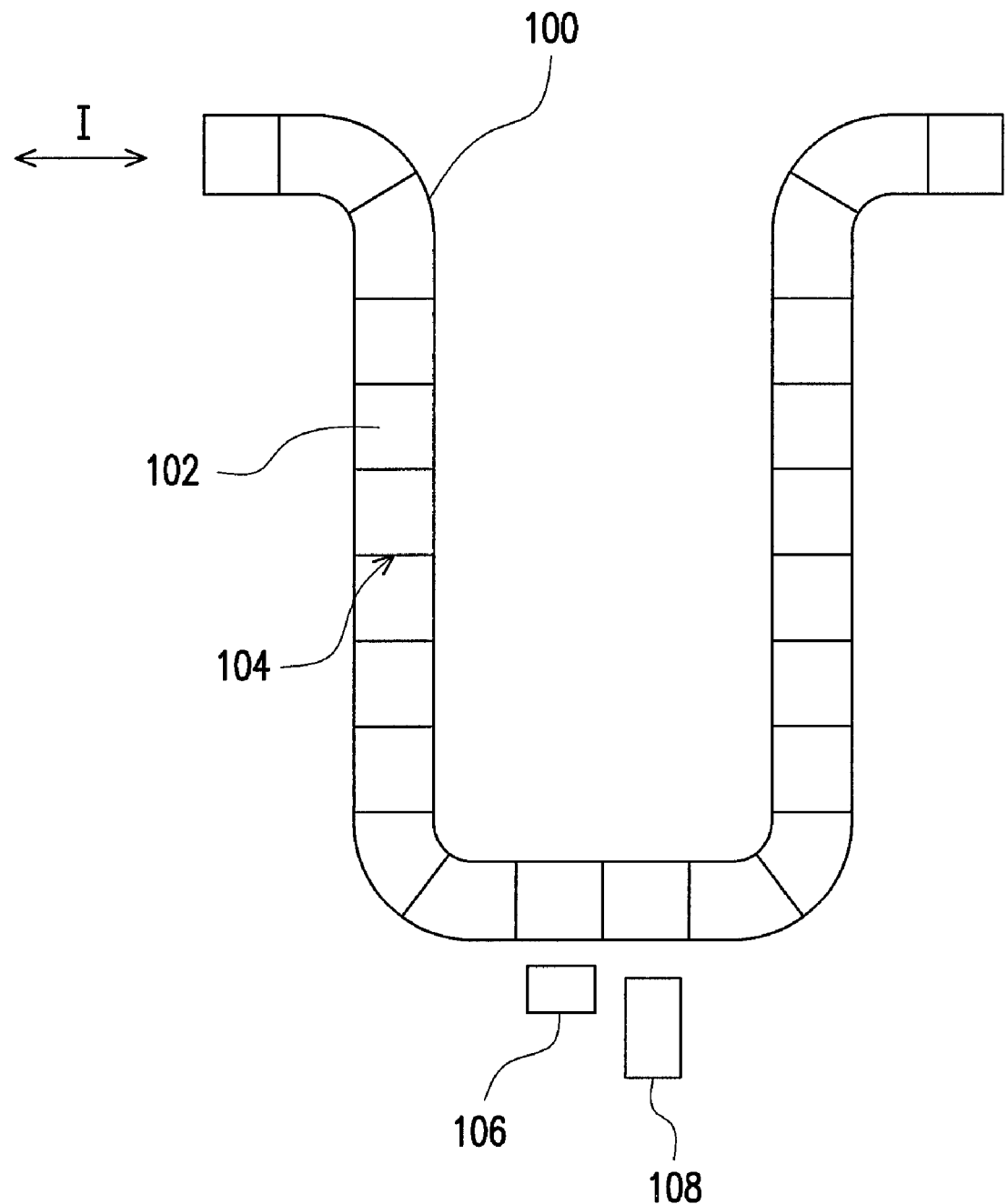
FIG. 1 is a schematic view illustrating a conventional magnetic shift register designed by implementing a current-driven domain wall motion mechanism.
Figure 2A:
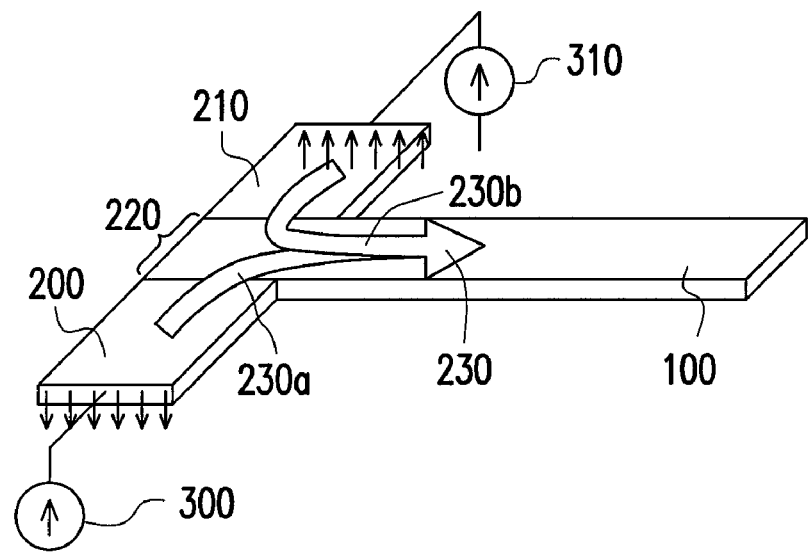
FIGS. 2A and 2B are respectively schematic three-dimensional view and schematic top view illustrating a magnetic memory structure according to an embodiment.
Figure 2B:
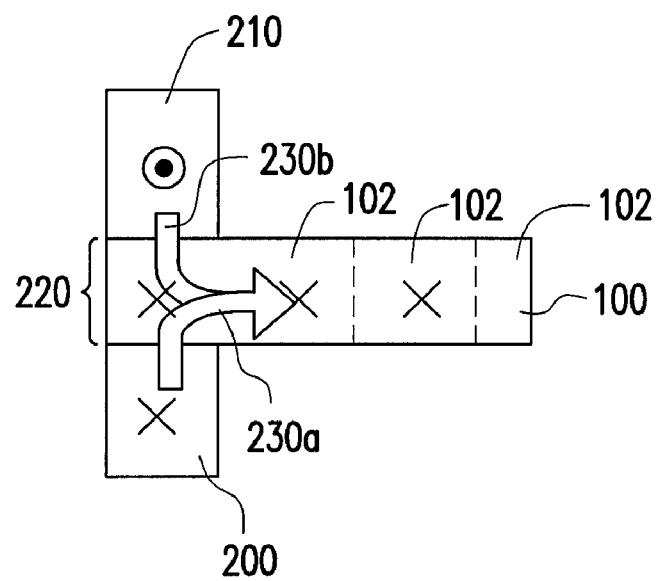

FIGS. 2A and 2B are respectively schematic three-dimensional view and schematic top view illustrating a magnetic memory structure according to an embodiment. As indicated in FIGS. 2A and 2B, a magnetic memory structure includes a memory track 100 which has consecutive magnetic domains 102. Each of the magnetic domains 102 has memory capacity of one bit. Besides, two domain-wall injecting layers 200 and 210 intersect and connect a terminal 220 of the memory track 100 in a manner of right angles, for example, which should not be construed as a limitation of the embodiment. The domain-wall injecting layer 200 constantly stores a binary data, for example, while the domain-wall injecting layer 210 constantly stores another binary data different from the binary data constantly stored in the domain-wall injecting layer 200.

The constantly-stored binary data are not changed by data operation or data access. However, specific magnetization direction can be written during fabrication based on actual demands, so as to form embedded write-in data. A magnetization direction of vertical magnetic materials is perpendicular to a plane of the memory track 100, as shown by arrows 230 in FIGS. 2A and 2B. The magnetization direction corresponds to a binary data. For instance, the magnetization direction of the domain-wall injecting layer 200 constantly faces down, while the magnetization direction of the domain-wall injecting layer 210 constantly faces up. During fabrication of the memory track 100, magnetic domain data "0" and "1" are pre-written into the domain-wall injecting layers 200 and 210.

It can be observed from FIG. 2B that the magnetic domains 102 on the memory track 100 all have a downward magnetization direction which is identical to the magnetization direction of the domain-wall injecting layer 200, for example. There is no domain wall between the domain-wall injecting layer 200 and the adjacent magnetic domain 102 on the memory track 100, while there is a domain wall between the domain-wall injecting layer 210 and the adjacent magnetic domain 102. In other words, the magnetization directions of the domain-wall injecting layers 200 and 210 are opposite to each other, and therefore the memory track 100 and one of the domain-wall injecting layers 200 and 210 together form a domain wall.

During a write-in operation, based on the data to be written into the adjacent magnetic domains 102, a driving current source 300 or a driving current source 310 can push the magnetic domain data "0" or "1" into the memory track 100 from the domain-wall injecting layer 200 or the domain-wall injecting layer 210 along a current flow path 230a or 230b, as shown by arrows 230 in FIGS. 2A and 2B. The driving current sources 300 and 310 pushing the magnetic domains 102 not only can write the data "0" and "1" onto the memory track 100, but also can motivate the operation of the domain walls in the memory track 100. Accordingly, power required by a writing device can be saved.

Figure 3:
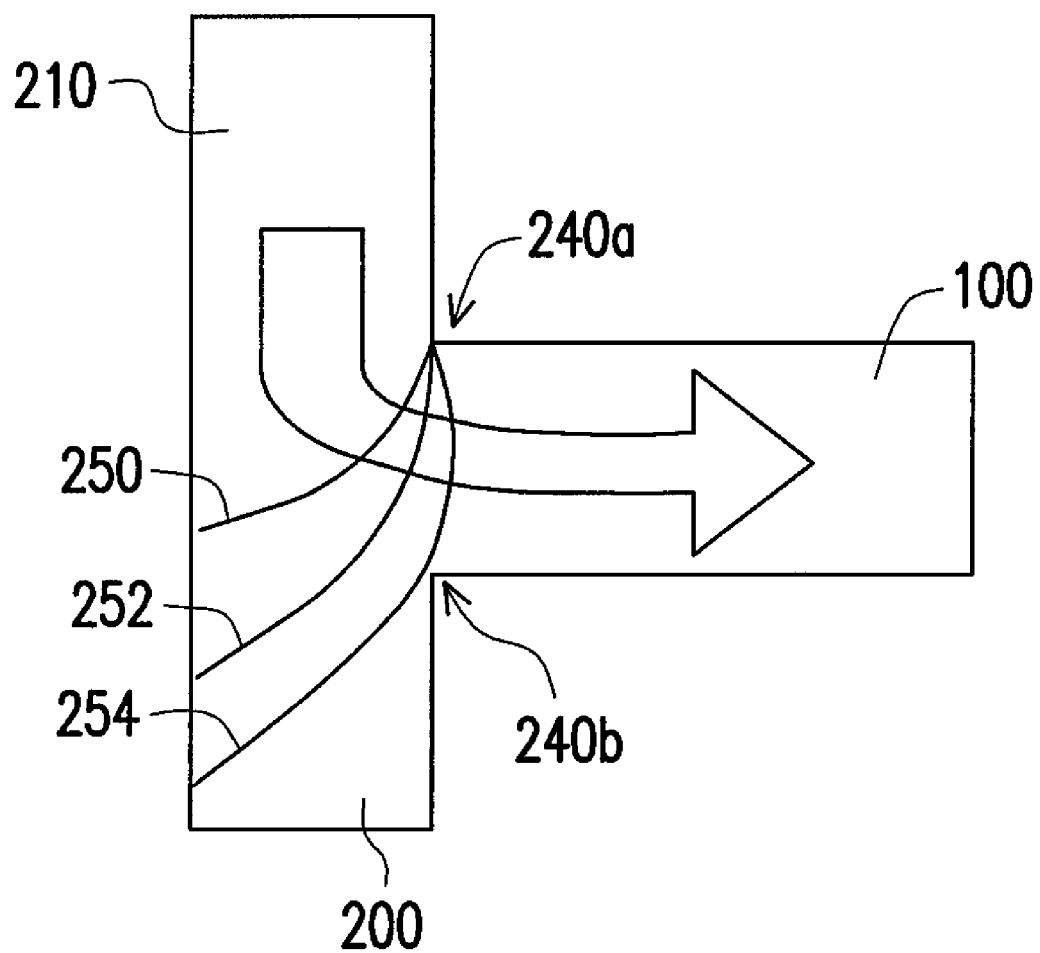
FIG. 3 is a schematic diagram illustrating a domain wall motion mechanism according to an embodiment.

The domain wall motion mechanism is described hereinafter. FIG. 3 is a schematic diagram illustrating a domain wall motion mechanism according to an embodiment. With reference to FIG. 3, based on FIG. 2A, when the data of the domain-wall injecting layer 210 are written onto the memory track 100, the domain wall of the domain-wall injecting layer 210 is moved to domain wall geometric locations 250, 252, and 254 according to the time at which the current is applied due to corner structures 240a and 240b, one end of the domain wall is pinned at the corner structure 240a, and the domain wall is then shifted toward the other corner structure 240b. The domain wall eternally contacts the corner structure 240b and is split into two domain walls to be injected into the memory track 100.

Figure 4:
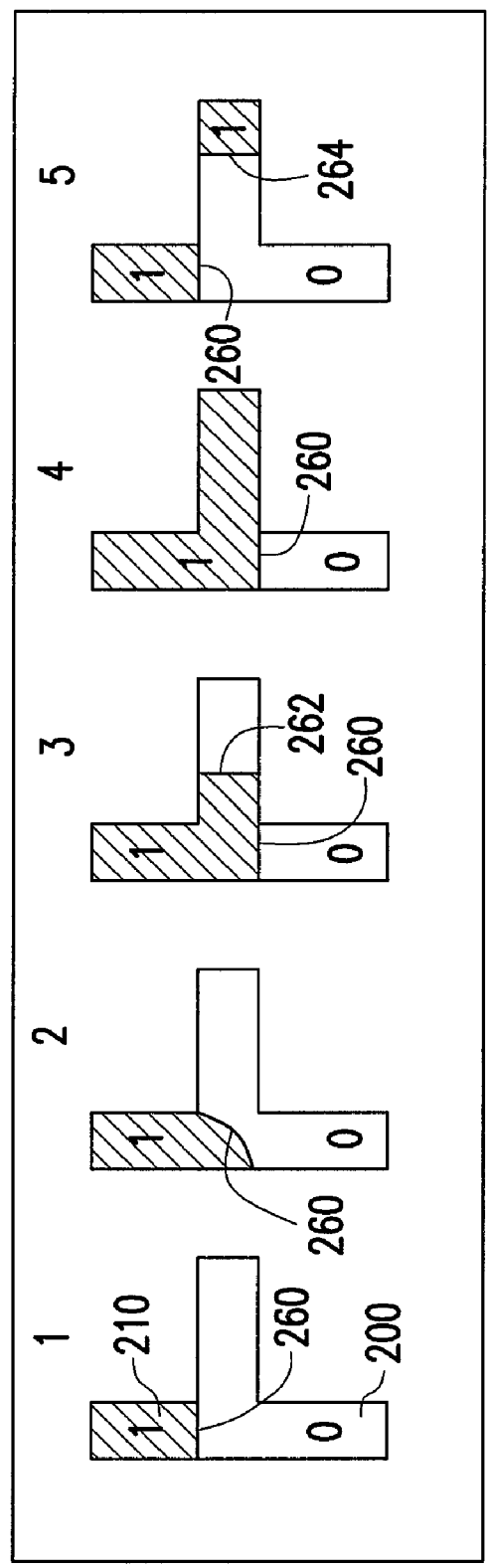
FIG. 4 is a schematic diagram illustrating the domain wall motion mechanism varying along with time according to an embodiment.

FIG. 4 is a schematic diagram illustrating the domain wall motion mechanism varying along with time according to an embodiment. As shown in FIG. 4, a simulation result of writing the data "0" and "1" is depicted in detail. At different time points (1)-(5), distribution of the domain wall in the T-shaped track is shown in FIG. 4. Initially, at the time point (1), data on the memory track are assumed to be "0". At the time point (2), the upper domain wall 260 is injected and bent. At the time point (3), the domain wall 260 is continuously injected and then split into two domain walls 260 and 262. The domain wall 262 is injected into the memory track to write data "1" therein, while the location of the domain wall 260 is pinned at the corner. At the time point (4), data "0" is to be written, for example. The lower domain wall 260 is to be injected into the memory track. At the time point (5), the lower domain wall 260 is again split into two domain walls 260 and 264. The domain wall 264 is injected into the track. Namely, the data "0" is written into the magnetic domains on the track. From the simulation result, data can be actually written into the magnetic domains by injection. Namely, the data "0" and "1" can be sequentially pushed onto the track together with data streams to be written, such that the data are written into the magnetic domains. When the domain wall is injected into the track, the domain wall is also shifted. Thus, in the structure, the driving current represents a conventional write-in current which is no longer required in the embodiment.

Figure 5:
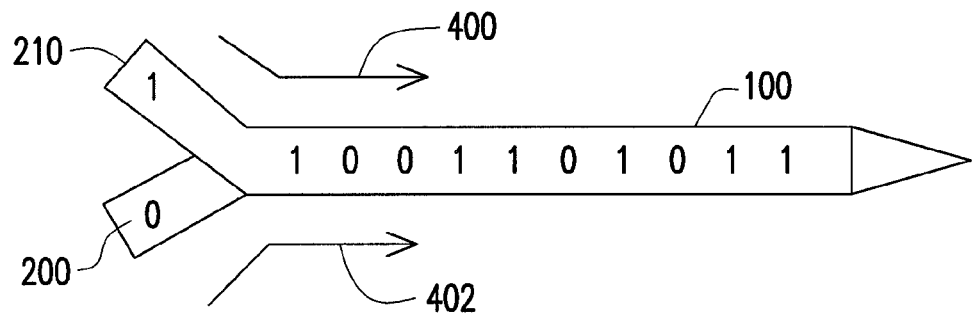
FIG. 5 is a schematic view illustrating a magnetic memory structure having a Y-shaped memory track according to an embodiment.

The embodiment is embodied above by taking the T-shaped memory track as an example. In practice, a Y-shaped track or other types of tracks are applicable. FIG. 5 is a schematic view illustrating a magnetic memory structure with a Y-shaped track according to an embodiment. With reference to FIG. 5, the two domain-wall injecting layers 200 and 210 are connected in a manner of oblique angles. Moving paths of the current are shown by arrows 400 and 402, and individual magnetic domains on the memory track 100 respectively store a binary data. Owing to the domain wall motion mechanism, each time when a driving operation is performed, the data in each magnetic domain are moved to the next magnetic domain.

Figure 6:
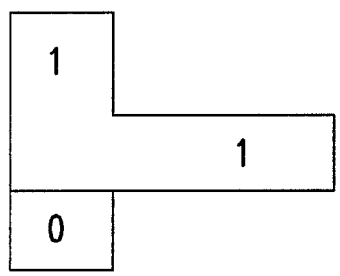
FIG. 6 is schematic diagrams illustrating structural variations of domain-wall injecting layers 200 and 210 in a magnetic memory structure according to an embodiment.
Figure 6:
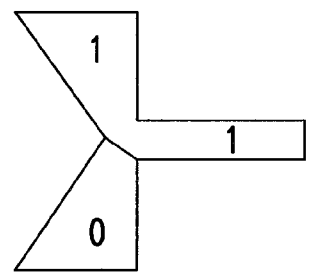
Figure 6:
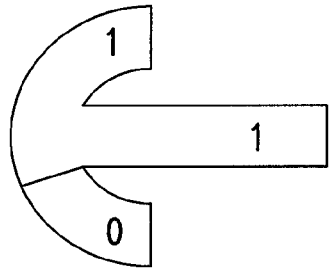
Figure 6:
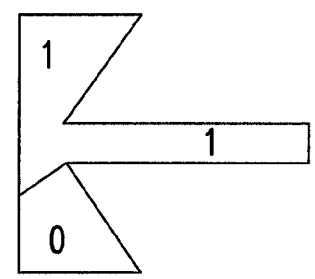

FIG. 6 is schematic diagrams illustrating structural variations of domain-wall injecting layers 200 and 210 in a magnetic memory structure according to an embodiment. FIG. 6(a) illustrates a T-shaped design. Since the adjacent magnetic domain on the memory track stores the data "1", the domain wall is on the lower domain-wall injecting layer. Besides, in FIG. 6(b), the domain-wall injecting layers 200 and 210 have an inner sunken structure at the side. In FIG. 6(c), the domain-wall injecting layers 200 and 210 even have a bent structure. Namely, there are corners between the memory track and the domain-wall injecting layers 200 and 210. Moreover, in FIG. 6(d), the corners between the memory track and the domain-wall injecting layers 200 and 210 have an inner sunken structure. Other designs will be further described hereinafter.

Figure 7:
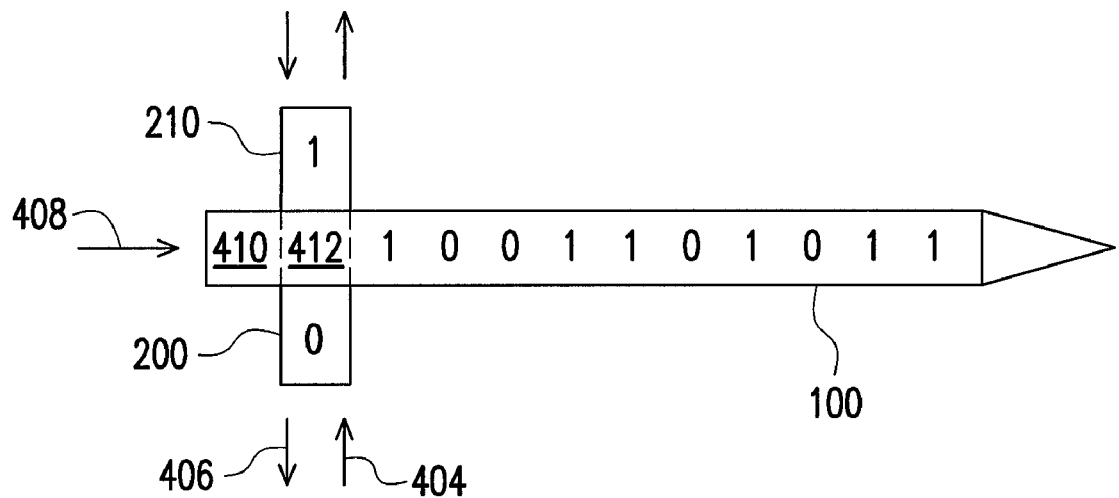
FIG. 7 is a schematic view illustrating a magnetic memory structure with a three-terminal track according to an embodiment.
Figure 8:
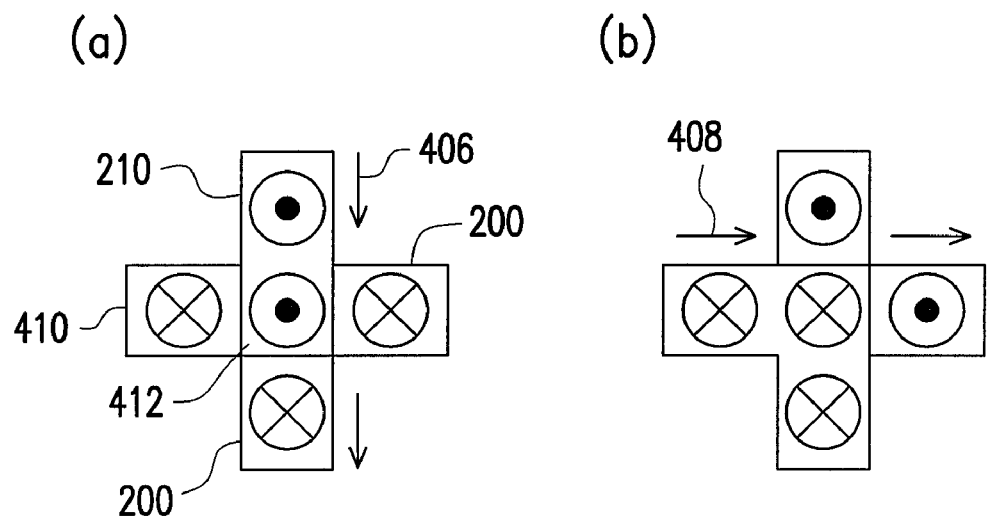
FIG. 8 is a schematic diagram illustrating a driving current according to the embodiment depicted in FIG. 7.

The structure between the memory track 100 and the domain-wall injecting layers 200 and 210 has two terminals. The driving current is input from the two domain-wall injecting layers 200 and 210, so as to inject the domain wall into the memory track 100. Nonetheless, the structure between the memory track 100 and the domain-wall injecting layers 200 and 210 can also have three current control terminals. FIG. 7 is a schematic view illustrating a magnetic memory structure with a three-terminal track according to an embodiment. FIG. 8 is a schematic diagram illustrating a driving current according to the embodiment depicted in FIG. 7. With reference to FIGS. 7, 8(a), and 8(b), the terminals of the memory track 100 and the domain-wall injecting layers 200 and 210 together form a T-shaped structure with a buffer region 412 for injection. Besides, there is a current input terminal 410. The domain-wall injecting layers 200 and 210 constantly connect the memory track 100 at the buffer region 412. With the T-shaped structure, the driving current is separately applied at two stages. At the first stage, the driving current is applied upwards or downwards as shown by arrows 404 and 406. The upward driving current indicated by the arrow 404 pushes the data "0" of the domain-wall injecting layer 200 onto the memory track 100 at the buffer region 412. In FIG. 8(a), the downward driving current indicated by the arrow 406 pushes the data of the domain-wall injecting layer 210 onto the memory track 100 at the buffer region 412. Next, as shown in FIG. 8(b), the other driving current pushes the data on the buffer region 412 onto the magnetic domain of the memory track 100 along the direction of the arrow 408. Namely, the write-in operation is performed by sequentially applying the upward driving current and the downward driving current. The magnetization direction at the current input terminal 410 does not pose an impact on the operation result because the magnetic domain is shifted as long as there is a domain wall in the memory track 100. Even though the data stored on the memory track 100 are identical, and there is no domain wall, the data stored on the memory track 100 are still the same when the magnetic domain is not shifted.

Figure 9:
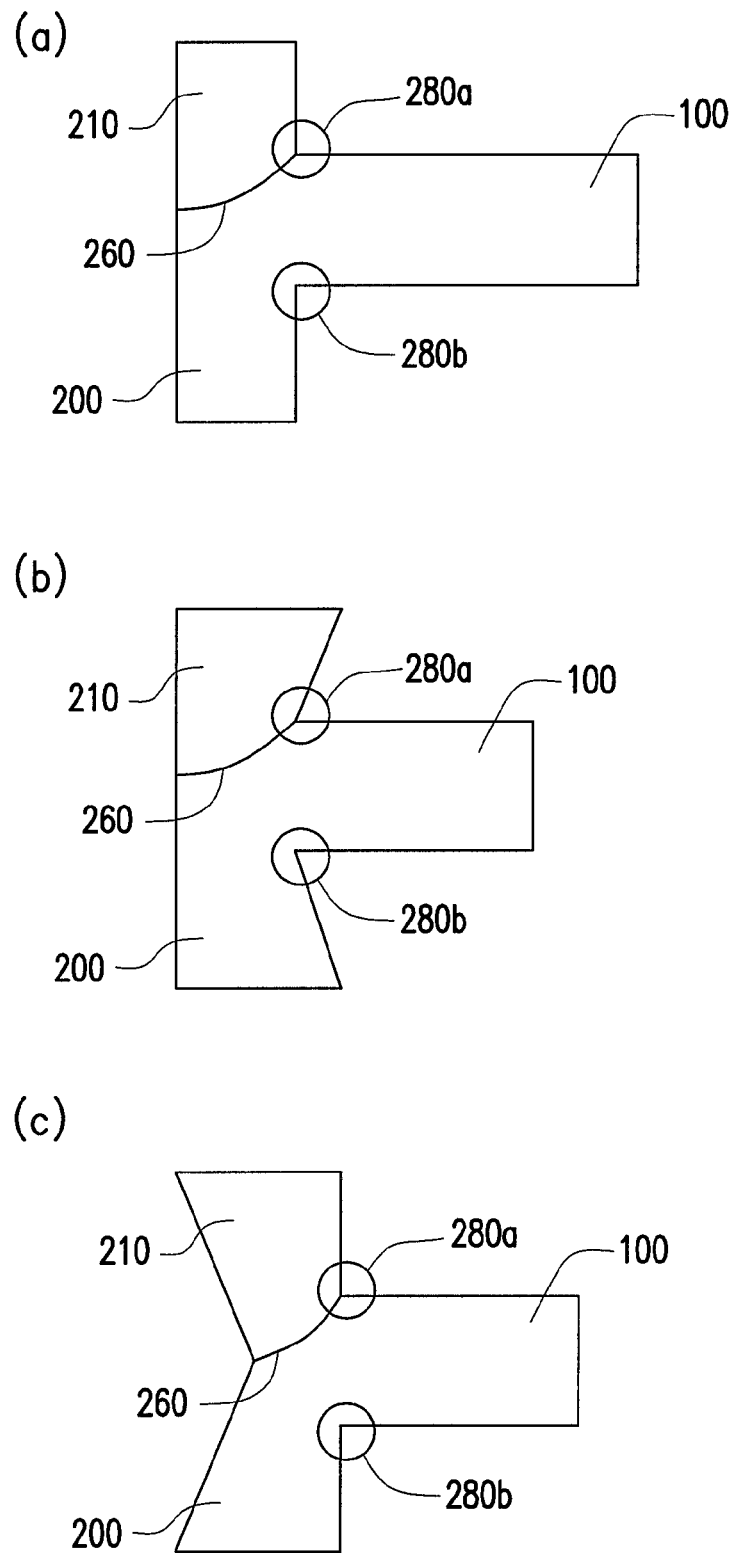
FIG. 9 is schematic diagrams illustrating designs of domain-wall injecting regions and a memory track according to an embodiment.

The design of the memory track is described below. There should be corners at domain-wall injecting regions to restrict the domain wall motion. The corners can be at the connection between the memory track and different domain walls. FIG. 9 is schematic diagrams illustrating designs of domain-wall injecting regions and a memory track according to an embodiment. As shown in FIGS. 9(a) and 3, when the current is constantly applied, the domain wall 260 is pinned and dragged. As the domain wall 260 contacts the corner 280a, the domain wall 260 is split into two, the data on the domain wall are written onto the memory track 100, and a domain-wall injecting region is then formed at the other terminal. However, the domain wall can also have other geometric structures to restrict locations of the two terminals of the domain wall on the memory track 100. When the domain wall contacts the opposite corner 280b, the domain wall is split into a domain-wall injecting region and a region injected into the memory track 100. Based on the above, the domain-wall injecting layers 200 and 210 can have a variety of geometric structures. With reference to FIG. 9(b), the corner 280a is the pinning terminal of the domain wall. When the driving pulse current is constantly applied, the domain wall 260 is pushed to the other corner 280b and split into two domain walls when the domain wall 260 contacts the corner 280b. In FIG. 9(c), given that there is a notch at the other side of the domain-wall injecting layers 200 and 210, the notch and the corner 280a can initially pin the domain wall 260 well.

Figure 10:
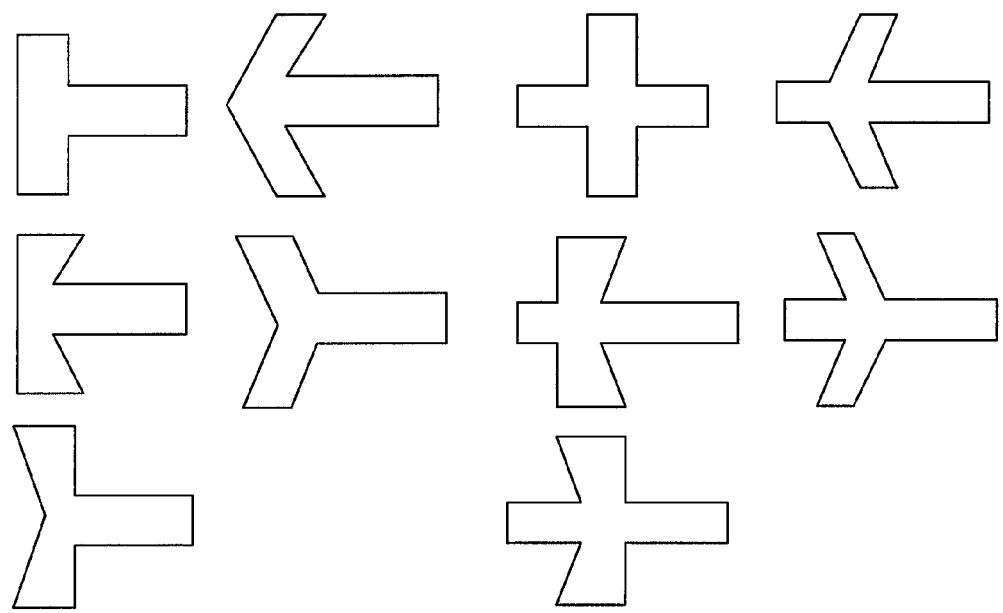
FIG. 10 is a schematic view illustrating a connection structure between the domain-wall injecting layers 200 and 210 and a memory track 100 according to an embodiment.

Other modifications made to the two-terminal device and the three-terminal devices are described hereinafter. FIG. 10 is a schematic view illustrating a connection structure between the domain-wall injecting layers 200 and 210 and the memory track 100 according to an embodiment. The left five structures in FIG. 10 are designed for the two-terminal device. The structures can also be applicable to the three-terminal device if a driving current input terminal is disposed at an initial terminal of the memory track 100.

Figure 11:
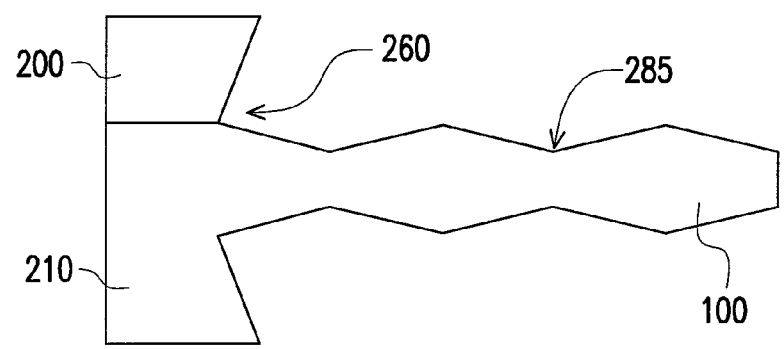
FIG. 11 is a schematic view illustrating a connection structure between the domain-wall injecting layers 200 and 210 and a memory track 100 according to an embodiment.

FIG. 11 is a schematic view illustrating a connection structure between the domain-wall injecting layers 200 and 210 and the memory track 100 according to an embodiment. In FIG. 11, there is a notch 285 between two adjacent magnetic domains on the memory track 100. The notch 285 can pin the domain wall, such that the data are merely written into the adjacent magnetic domain when the domain wall is injected into the memory track 100 from the two domain-wall injecting layers 200 and 210. Here, no error occurs because of long operation time.

Figure 12:
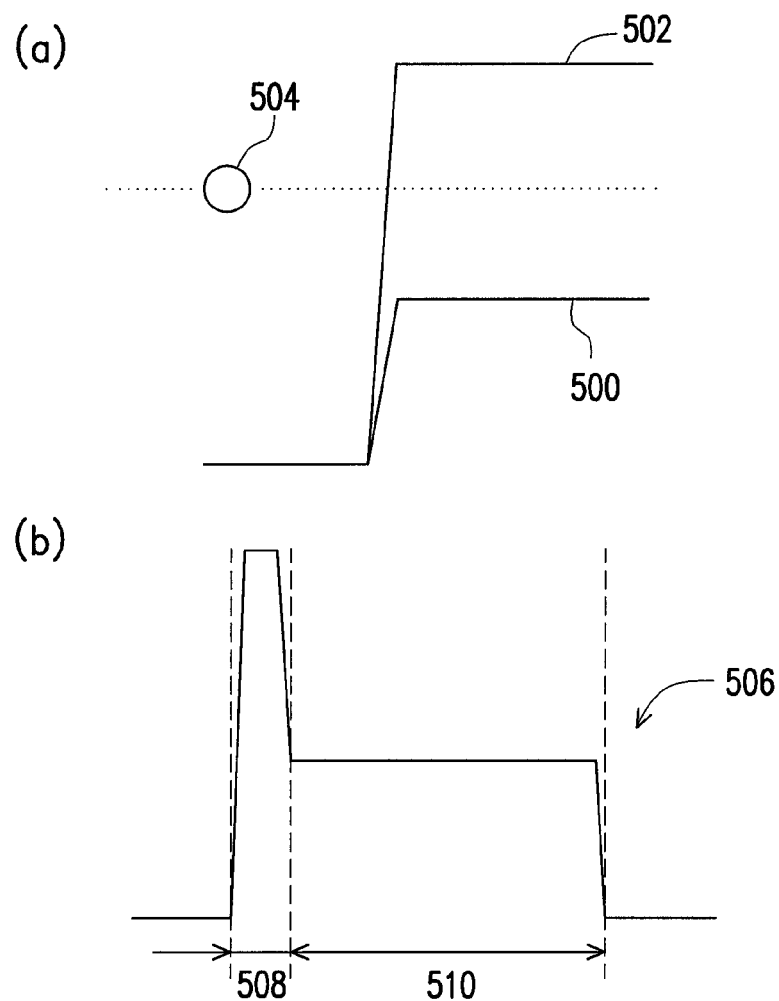
FIG. 12 is schematic diagrams illustrating the correlation between waveforms of a driving current and energy potential barriers of domain walls existing in the corners of injecting layers and notches.

To be more specific, FIG. 12 is schematic diagrams illustrating the correlation between waveforms of a driving current and energy potential barriers of magnetic domains. In general, the notch 285 in the memory track ensures that the energy potential barrier 502 depinning the domain wall on the memory track from the notch 285 is higher than the energy potential barrier 500 allowing the domain wall to pass the corner on the memory track, as indicated in FIG. 12(a). Hence, given that the operation energy 504 is between the energy potential barrier 500 and the energy potential barrier 502, the domain wall which is not pinned by the notch 285 can be moved.

In consideration of the above, the waveform as shown in FIG. 12(b) is described in the embodiment. The former portion of the waveform 508 with short wavelength shows that the domain wall is depinned at the notch 285, and that the domain wall is injected into the memory track at the injecting region. After that, amplitude of the latter portion of the waveform 510 lasting for a longer time results in domain wall motion but does not depin the domain wall from the notch 285. The waveform indicates the improvement of stability of the domain wall motion in the entire memory track. In the former portion of the waveform, all the domain walls are depinned from the notch 285 and the corners, while the latter portion of the waveform allows the domain wall motion without moving the domain wall to pass the barrier of the next notch. Besides, due to the dragging behaviors of domain wall motion, the high pulse 508 can also excite domain walls and make the motion more easily. Thereby, domain walls are all moved forward by a bit interval without generating bit error data because overly large current may cause excessively fast domain wall motion.

Figure 13:
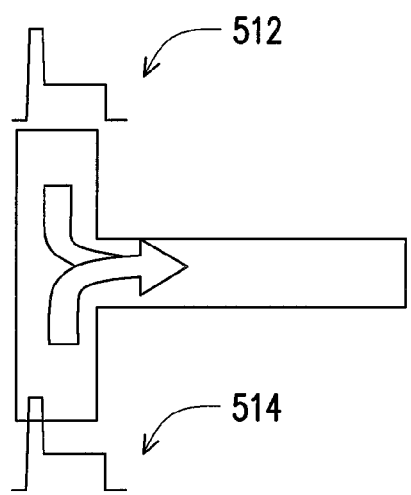
FIG. 13 is a schematic diagram illustrating actual application of the waveforms depicted in FIG. 12(b) according to an embodiment.

FIG. 13 is a schematic view illustrating actual application of the waveforms depicted in FIG. 12(b) according to an embodiment. In FIG. 13, the waveform of the driving current 512 is shown as depicted in FIG. 12(b). The waveform indicates that the driving current 512 moves the data stored in the upper domain-wall injecting layer 210 onto the memory track. Besides, the waveform of the driving current 514 is shown as depicted in FIG. 12(b). The waveform indicates that the driving current 514 moves the data stored in the lower domain-wall injecting layer 200 onto the memory track, as indicated by the arrows. Based on the above-mentioned waveforms of the driving current, it is known that the driving current applies better when the memory track has the notch design, while the driving current is still applicable even though there is no notch on the memory track.

Figure 14:
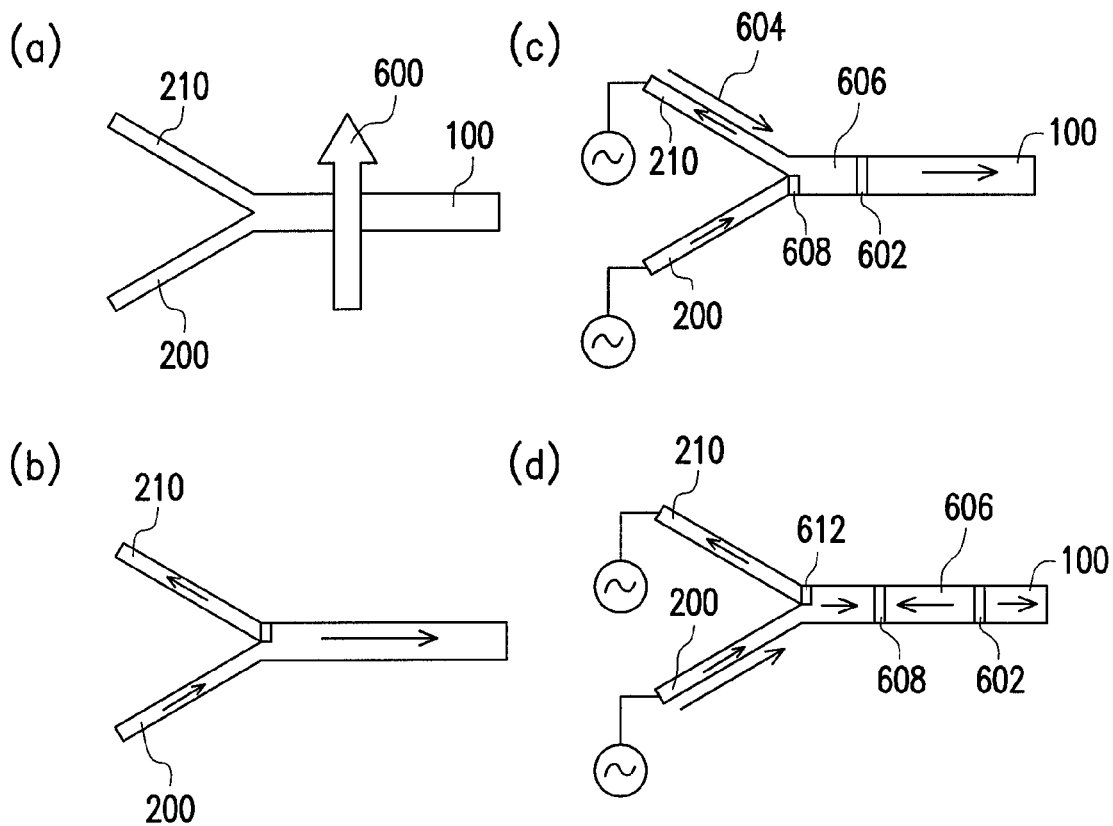
FIG. 14 is schematic diagrams illustrating a manufacturing process of a Y-shaped magnetic memory structure according to an embodiment.

Fabrication of the domain-wall injecting layers 200 and 210 is then described hereinafter. FIG. 14 is schematic views illustrating a manufacturing process of a Y-shaped magnetic memory structure according to an embodiment. As shown in FIG. 14(a), horizontal magnetic materials are employed in a Y-shaped memory track. However, the shape of the memory track is not limited herein, and any type of memory track which can accomplish similar effects is applicable. After the track material is fabricated, a reset field 600 at a Y direction is first induced to change the direction of the magnetic domains on the entire track. Next, the reset field is shut down. With reference to FIG. 14(b), the direction of the magnetic domains is arranged in the manner corresponding to the track shape. The domain wall is spontaneously formed at the corner of the Y-shaped track, and the domain wall serves as a permanent data source of the magnetic domains. In FIG. 14(c), during operation of the device, the binary data of the domain-wall injecting layer 210 are moved onto the magnetic domain 606 on the memory track 100 along the direction of the arrow 604 according to the magnetic domain data needed to be written. At this time, the domain wall 602 originally on the memory track 100 is moved to the next magnetic domain. On the other hand, the domain wall 608 is spontaneously formed between the domain-wall injecting layer 210 and the Y-shaped memory track 100 at the corner, and therefore the direction of the magnetic domains can be maintained by the domain-wall injecting layer 200 and is not changed. In FIG. 14(d), when the data of the domain-wall injecting layer 200 are to be written onto the memory track 100, the domain wall 608 is injected into the memory track 100. Here, another domain wall 612 is spontaneously formed.

Figure 15:
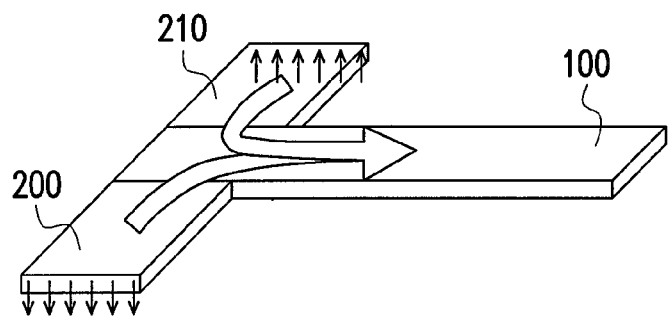
FIG. 15 is a schematic diagram illustrating an operation method of domain-wall injecting regions made of vertical materials according to an embodiment.

Since the initial direction of the domain-wall injecting region cannot be determined by the track shape when the vertical materials are employed, a pre-write operation should be performed on the domain-wall injecting layers 200 and 210. FIG. 15 is a schematic view illustrating an operation method of domain-wall injecting regions made of vertical materials according to an embodiment. Application of the vertical materials is similar to application of the horizontal materials. According to the magnetic domain data needed to be written, the corresponding domain wall is pushed by the permanent domain-wall injecting region onto the memory track, so as to write data into the magnetic domains as equivalently achieved by the related art.

Figure 16:
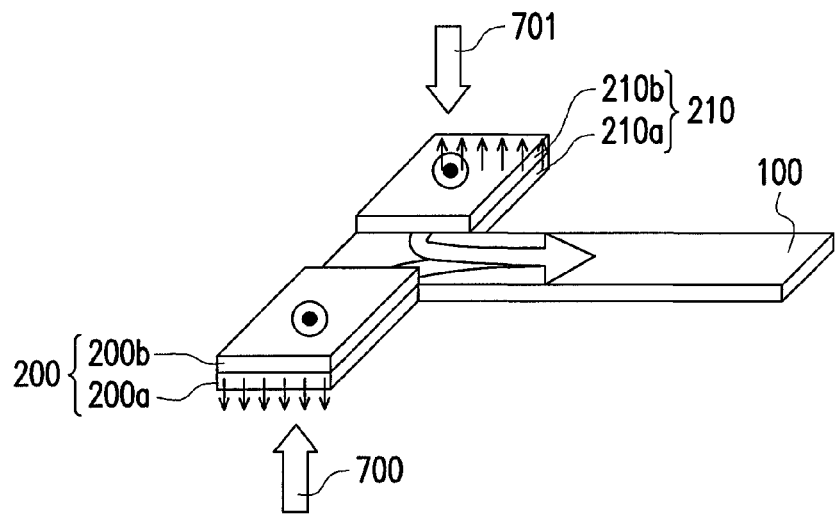
FIG. 16 is a schematic diagram illustrating a pre-write operation performed on domain-wall injecting regions according to an embodiment.

The fabrication of and the pre-write operation on the domain-wall injecting layers 200 and 210 made of the vertical materials are described below. In addition to the above-mentioned horizontal device in which the direction of the pre-write domain-wall injecting regions is arranged in the manner corresponding to the track shape, other pre-write methods suitable for the horizontal materials and the vertical materials are introduced hereinafter. FIG. 16 is a schematic diagram illustrating a pre-write operation performed on domain-wall injecting regions according to an embodiment. With reference to FIG. 16, when spin transfer torque (STT) is applied, for example, a tunnel junction 210a and a magnetic pinning layer 210b are formed on the domain-wall injecting layers 200 and 210. The domain-wall injecting layers 200 and 210 are considered as free layers. Similar to the STT device, the domain-wall injecting layers 200 and 210 can have directions changed by the opposite currents 700 and 701, such that the pre-write operation is completed. After the device is completely formed, note that the pre-write operation is performed once. Thus, life span of the device is not as short as that of the STT device. Moreover, the magnetic tunnel junction (MTJ) device can detect whether a write-in error occurs in the domain-wall injecting region and perform the pre-write operation again if necessary.

Figure 17:
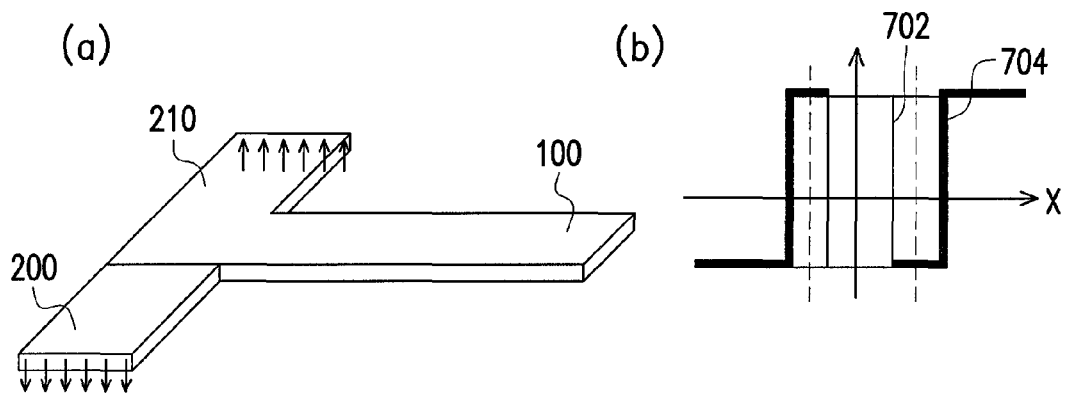
FIG. 17 is schematic diagrams illustrating a pre-write operation performed on domain-wall injecting layers according to an embodiment.

FIG. 17 is schematic diagrams illustrating a pre-write operation performed on domain-wall injecting layers according to an embodiment. As indicated in FIGS. 17(a) and 17(b), the pre-write operation is performed on the domain-wall injecting layers 200 and 210 by doping. Such as the elements Ni, Au, Cu, and Ag, can be doped in the domain-wall injecting layers 200 and 210 to equip the magnetic substance in the magnetic domains with different magnetic anisotropy. As shown in FIG. 17(a), one or both domain-wall injecting regions doped with the elements have different magnetic anisotropy from that of the track. If a reset field is properly generated, one local region in magnetization direction is changed while another local region is not changed. The domain-wall injecting regions thereby can have opposite directions, and the pre-write operation can then be completely performed. Besides, in FIG. 17(b), a loop 702 is adopted to write data in a certain state. By contrast, another loop 704 is used to move the data from the domain-wall injecting layers 200 and 210 onto the memory track 100.

Figure 18:
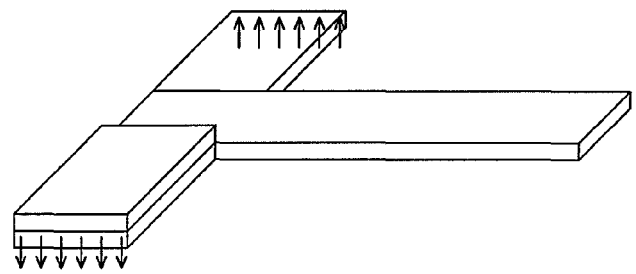
FIG. 18 is a schematic diagram illustrating a pre-write operation performed on domain-wall injecting layers according to an embodiment.

FIG. 18 is a schematic diagram illustrating a pre-write operation performed on domain-wall injecting layers according to an embodiment. In FIG. 18, a magnetic exchange layer is disposed on one of the domain-wall injecting layers 200 and 210. Magnetic anisotropy of the magnetic domains can be changed by the interaction between the magnetic exchange layer and the domain-wall injecting layer. In the embodiment, the direction of the magnetic domains can be changed or not changed when the reset field is properly induced, as shown by arrows in FIG. 18. As such, the pre-write operation is completed.

In the embodiment, a magnetic shift register structure with low power consumption is provided. Write-in data signal sources are embedded into a magnetic track in the magnetic shift register structure because of shape design of the track. Since the data to be written can be directly moved onto the memory track in the magnetic shift register structure, it is not necessary to additionally fabricate a writing device.

Besides, at least the fabrication costs and operating the writing device with required power can be saved according to the embodiment. When the magnetic domains on the memory track are made of materials with high anisotropy in order to improve thermal stability of the memory device, no additional writing lines for changing the direction of the magnetic domains are required. Accordingly, power consumption on operation of the writing lines can be prevented, and the memory architecture can be simplified.

The embodiments that have been described above are illustrative of certain applications of the principle of the embodiment. Therefore, the embodiment in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory structure, comprising:
   a memory track having a plurality of consecutive magnetic domains, each of the magnetic domains having memory capacity of one bit;
   a first domain-wall injecting layer intersecting and connecting a terminal of the memory track and constantly storing a first binary data; and
   a second domain-wall injecting layer against the first domain-wall injecting layer, the second domain-wall injecting layer intersecting and connecting the terminal of the memory track and constantly storing a second binary data different from the first binary data,
   wherein the memory track and one of the first domain-wall injecting layer and the second domain-wall injecting layer together form a domain wall.

2. The magnetic memory structure as claimed in claim 1, wherein the memory track, the first domain-wall injecting layer, and the second domain-wall injecting layer have a horizontal magnetization direction.

3. The magnetic memory structure as claimed in claim 2, wherein the memory track, the first domain-wall injecting layer, and the second domain-wall injecting layer together form a Y-shaped structure.

4. The magnetic memory structure as claimed in claim 3, wherein the terminal of the memory track has a first terminal surface and a second terminal surface, and the first domain-wall injecting layer and the second domain-wall injecting layer respectively connect the first terminal surface and the second terminal surface to form the Y-shaped structure.

5. The magnetic memory structure as claimed in claim 1, wherein the memory track, the first domain-wall injecting layer, and the second domain-wall injecting layer have a perpendicular magnetization direction.

6. The magnetic memory structure as claimed in claim 5, wherein the first domain-wall injecting layer and the second domain-wall injecting layer respectively have a stacked layer structure and comprise:
   a magnetic pinning layer;
   a tunnel junction; and
   a free layer storing the first binary data or the second binary data and connecting the memory track.

7. The magnetic memory structure as claimed in claim 5, wherein one of the first domain-wall injecting layer and the second domain-wall injecting layer is doped with a predetermined element to have magnetic anisotropy different from magnetic anisotropy of the memory track.

8. The magnetic memory structure as claimed in claim 5, wherein the first domain-wall injecting layer and the second domain-wall injecting layer are doped with a predetermined element to have magnetic anisotropy different from magnetic anisotropy of the memory track.

9. The magnetic memory structure as claimed in claim 5, wherein one of the first domain-wall injecting layer and the second domain-wall injecting layer further comprises a magnetic exchange layer to equip the one of the first domain-wall injecting layer and the second domain-wall injecting layer with magnetic anisotropy different from magnetic anisotropy of the memory track.

10. The magnetic memory structure as claimed in claim 1, wherein the first domain-wall injecting layer and the second domain-wall injecting layer horizontally intersect the memory track to move the first binary data or the second binary data to the memory track at a terminal one of the magnetic domains, and the terminal one of the magnetic domains of the memory track is a current input terminal to push the moved first binary data or the moved second binary data onto the memory track.

11. The magnetic memory structure as claimed in claim 1, wherein an included angle between the memory track and the first domain-wall injecting layer and an included angle between the memory track and the second domain-wall injecting layer are equal obtuse angles, right angles, or acute angles.

12. The magnetic memory structure as claimed in claim 1, wherein the first domain-wall injecting layer and the second domain-wall injecting layer respectively have equal widths in a direction toward the memory track or are in decreasing widths along a longitudinal direction toward the memory track.

13. The magnetic memory structure as claimed in claim 1, wherein there is a notch between adjacent two of the magnetic domains on the memory track.

14. An operation method applied to the magnetic memory structure as claimed in claim 1, the operation method comprising:
   applying a write-in pulse current to the first domain-wall injecting layer or the second domain-wall injecting layer to move the first binary data or the second binary data into one of the magnetic domains on the memory track.

15. The operation method as claimed in claim 14, wherein the write-in pulse current comprises a depinning region and a transmission region following the depinning region, and a pulse height of the depinning region is greater than a pulse height of the transmission region.

16. The operation method as claimed in claim 14, wherein the write-in pulse current has an equal pulse height and a time interval.

17. The operation method as claimed in claim 14, wherein a notch is formed at an intersection of adjacent two of the magnetic domains on the memory track to prevent the domain wall from moving over two of the magnetic domains.

18. An operation method applied to the magnetic memory structure as claimed in claim 1, the operation method comprising:
   applying a first pulse current to the first domain-wall injecting layer or the second domain-wall injecting layer to move the first binary data or the second binary data into a terminal one of the magnetic domains on the memory track; and
   applying a second pulse current to the memory track to move data of the terminal one of the magnetic domains to the memory track.

19. The operation method as claimed in claim 18, wherein the write-in pulse current comprises a depinning region and a transmission region following the depinning region, and a pulse height of the depinning region is greater than a pulse height of the transmission region.

20. The operation method as claimed in claim 18, wherein the memory track has a magnetization direction perpendicular to a surface of the memory track.

* * * * *